United States Patent
Kim et al.

(10) Patent No.: US 9,305,940 B2
(45) Date of Patent: Apr. 5, 2016

(54) THIN FILM TRANSISTOR HAVING AN ACTIVE PATTERN AND A SOURCE METAL PATTERN WITH TAPER ANGLES

(71) Applicant: Samsung Display Co., LTD., Yongin, Gyeonggi-Do (KR)

(72) Inventors: Bong-Kyun Kim, Hwaseong-si (KR); Young-Min Moon, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/463,574

(22) Filed: Aug. 19, 2014

(65) Prior Publication Data

US 2015/0129868 A1    May 14, 2015

(30) Foreign Application Priority Data

Nov. 13, 2013 (KR) .......................... 10-2013-0137548

(51) Int. Cl.

| | |
|---|---|
| *H01L 29/10* | (2006.01) |
| *H01L 29/04* | (2006.01) |
| *H01L 29/12* | (2006.01) |
| *H01L 21/00* | (2006.01) |
| *H01L 27/12* | (2006.01) |
| *H01L 29/45* | (2006.01) |
| *H01L 21/441* | (2006.01) |

(Continued)

(52) U.S. Cl.
CPC ...... *H01L 27/1225* (2013.01); *H01L 21/32134* (2013.01); *H01L 21/441* (2013.01); *H01L 21/465* (2013.01); *H01L 21/467* (2013.01); *H01L 21/76846* (2013.01); *H01L 27/1259* (2013.01); *H01L 29/41733* (2013.01); *H01L 29/45* (2013.01); *H01L 29/7869* (2013.01); *H01L 29/78618* (2013.01); *H01L 21/02554* (2013.01); *H01L 21/02565* (2013.01)

(58) Field of Classification Search
CPC . H01L 29/786; H01L 29/45; H01L 21/32134; H01L 21/441; H01L 21/467; H01L 21/02254; H01L 27/786; H01L 27/1259; H01L 21/336; H01L 27/127
USPC ................ 257/43, E21.414, E29.275, 59, 71, 257/E21.409, E21.704; 438/34, 158, 609, 438/104, 156

See application file for complete search history.

(56) References Cited

U.S. PATENT DOCUMENTS

| | | |
|---|---|---|
| 8,216,865 B2 | 7/2012 | Choi et al. |
| 8,242,494 B2 | 8/2012 | Suzawa et al. |

(Continued)

FOREIGN PATENT DOCUMENTS

| | | |
|---|---|---|
| KR | 1020000039663 A | 7/2000 |
| KR | 1020060133827 A | 12/2006 |

(Continued)

*Primary Examiner* — Long K Tran
*Assistant Examiner* — Dzung Tran
(74) *Attorney, Agent, or Firm* — Innovation Counsel LLP (57) ABSTRACT

A thin film transistor includes a gate electrode, an active pattern overlapping with the gate electrode and including a semiconductive oxide, and a source metal pattern disposed on the active pattern and including a source electrode and a drain electrode spaced apart from the source electrode. The active pattern underlaps an entire portion of a lower surface of the source metal pattern and minimally protrudes beyond lateral ends of the source metal pattern due to the active pattern having sidewall taper angles that are substantially greater than corresponding and adjacent sidewall taper angles of the overlying source metal pattern. Thus parasitic capacitance may be reduced and performance enhanced.

10 Claims, 7 Drawing Sheets

(51) Int. Cl.
*H01L 21/465* (2006.01)
*H01L 21/467* (2006.01)
*H01L 21/768* (2006.01)
*H01L 21/3213* (2006.01)
*H01L 29/417* (2006.01)
*H01L 29/786* (2006.01)
*H01L 21/02* (2006.01)

(56) References Cited

U.S. PATENT DOCUMENTS

| | | | |
|---|---|---|---|
| 2007/0072439 A1* | 3/2007 | Akimoto et al. | 438/795 |
| 2008/0001154 A1* | 1/2008 | Lee | 257/59 |
| 2008/0042133 A1* | 2/2008 | Chin et al. | 257/59 |
| 2008/0203390 A1* | 8/2008 | Kim et al. | 257/59 |
| 2009/0224257 A1* | 9/2009 | Chin et al. | 257/72 |
| 2009/0321731 A1* | 12/2009 | Jeong et al. | 257/43 |
| 2010/0035379 A1* | 2/2010 | Miyairi et al. | 438/104 |
| 2010/0102315 A1* | 4/2010 | Suzawa et al. | 257/43 |
| 2010/0105162 A1* | 4/2010 | Suzawa et al. | 438/104 |
| 2010/0105163 A1 | 4/2010 | Ito et al. | |
| 2010/0105164 A1* | 4/2010 | Ito et al. | 438/104 |
| 2010/0270552 A1 | 10/2010 | Song et al. | |
| 2011/0012118 A1* | 1/2011 | Yamazaki et al. | 257/59 |
| 2011/0084280 A1* | 4/2011 | Nakayama et al. | 257/59 |
| 2011/0133193 A1* | 6/2011 | Song et al. | 257/59 |
| 2011/0193076 A1 | 8/2011 | Yun et al. | |
| 2012/0064678 A1 | 3/2012 | Lee et al. | |

FOREIGN PATENT DOCUMENTS

| | | |
|---|---|---|
| KR | 1020080030761 A | 4/2008 |
| KR | 1020110064051 A | 6/2011 |
| KR | 1020110128038 A | 11/2011 |

* cited by examiner

THIN FILM TRANSISTOR HAVING AN ACTIVE PATTERN AND A SOURCE METAL PATTERN WITH TAPER ANGLES

PRIORITY STATEMENT

This application claims priority under 35 U.S.C. §119 to Korean Patent Application No. 10-2013-0137548, filed on Nov. 13, 2013, and all the benefits accruing therefrom, the contents of which application are herein incorporated by reference in their entirety.

BACKGROUND

1. Field

The present disclosure of invention relates to a thin film transistor. More particularly, exemplary embodiments relate to a thin film transistor including a semiconductive oxide, a display substrate having the thin film transistor and a method of manufacturing the thin film transistor

2. Description of Related Technology

Generally, a thin film transistor (TFT) as used for example for driving a corresponding pixel unit in a display device includes a gate electrode, a source electrode, a drain electrode, and a channel layer forming a channel between the source electrode and the drain electrode. The channel layer includes a semiconductive layer (active layer) including amorphous silicon, polycrystalline silicon, semiconductive oxide, or the like.

Amorphous silicon has a relatively low electron mobility, which may be about 1 to about 10 $cm^2/V$, so that a thin film transistor including amorphous silicon has relatively low driving characteristics. In contrast, polycrystalline silicon has a relatively high electron mobility, which may be about 10 to about hundreds $cm^2/V$. However, a crystallization process is required for forming polycrystalline silicon at each location across the area of a substrate where the TFTs are formed. Thus, it is difficult to form a uniform polycrystalline silicon layer on a large-sized substrate (for example one used for large sized televisions), and resulting manufacturing costs are high. Semiconductive oxides may be formed through a low-temperature process, and may be easily large-scaled, and have a high electron mobility. Thus, research is actively being conducted on thin film transistors which include a semiconductive oxide in place of more traditional semiconductors.

For manufacturing a display substrate including a semiconductive oxide, a method using a photoresist pattern having a thickness gradient for a half-tone exposure is known and used.

However, when a semiconductive oxide pattern is formed by the method the photoresist pattern having a thickness grade, the semiconductive oxide pattern tends to protrude beyond an end of a source metal pattern in a lateral direction where the protruding part can define an excessive parasitic capacitance, where the latter may cause degradation of image quality such as creation of a waterfall effect.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

The present disclosure of invention provides a thin film transistor having a reduced lateral extension of a semiconductive oxide pattern and thus improved reliability and/or performance.

Exemplary embodiments disclosed herein also provide a display substrate including the thin film transistor.

Exemplary embodiments also provide a method of manufacturing the thin film transistor.

According to an exemplary embodiment, a thin film transistor includes a gate electrode, an active pattern overlapping with the gate electrode and including a semiconductive oxide, and a source metal pattern disposed on the active pattern and including a source electrode and a drain electrode spaced apart from the source electrode. The active pattern underlaps an entire portion of a lower surface of the source metal pattern while not excessively protruding beyond ends of the lower surface of the source metal pattern due to the active pattern having sidewall taper angles that are substantially greater than corresponding sidewall taper angles of the underlapped source metal pattern.

In an embodiment, the taper angle of the source metal pattern is 50 degrees to 80 degrees.

In an embodiment, the taper angle of the active pattern is 70 degrees to 90 degrees.

In an embodiment, the active pattern includes at least one member selected from the group consisting of zinc oxide, zinc tin oxide, indium zinc oxide, indium oxide, titanium oxide, indium gallium zinc oxide and indium zinc tin oxide.

In an embodiment, the source metal pattern includes a metal layer and a lower barrier layer disposed under the metal layer and contacting the active pattern.

In an embodiment, the source metal pattern further includes an upper barrier layer disposed on the metal layer.

In an embodiment, the metal layer includes copper.

In an embodiment, the lower barrier layer includes at least one member selected from the group consisting of indium zinc oxide, indium tin oxide, gallium zinc oxide and zinc aluminum oxide.

According to an exemplary embodiment, a display substrate includes a gate electrode disposed on a base substrate, an active pattern overlapping with the gate electrode and including a semiconductive oxide, a source metal pattern disposed on the active pattern and including a source electrode and a drain electrode spaced apart from the source electrode, and a pixel electrode electrically connected to the drain electrode. The active pattern underlaps an entire portion of a lower surface of the source metal pattern and minimally protrudes beyond lateral ends of the source metal pattern due to the active pattern having sidewall taper angles that are substantially greater than corresponding and adjacent sidewall taper angles of the source metal pattern.

According to an exemplary embodiment, a semiconductive oxide layer is formed on a base substrate. A source metal layer is formed on the semiconductive oxide layer. A first photoresist pattern having a thickness gradient is formed on the source metal layer. The source metal layer is etched by using the first photoresist pattern as a mask to form a source metal pattern. The first photoresist pattern is partially removed to form a second photoresist pattern. The semiconductive oxide layer is anisotropically etched for example by dry-etching to form an active pattern. The source metal pattern is isotropically etched for example by wet-etching and by using the second photoresist pattern to form a source electrode and a drain electrode spaced apart from the source electrode.

In an embodiment, the source metal layer and the source metal pattern are etched by a same etchant.

In an embodiment, the etchant includes a persulfate, an inorganic acid, a phosphate, a cyclic amine compound and water.

In an embodiment, the etchant does not include a fluorine-containing compound.

According to the exemplary embodiments, a lateral protrusion of an active pattern including a semiconductive oxide may be minimized without an additional mask.

Furthermore, a source metal layer and a source metal pattern may be etched by a same etchant. Thus, managing processes may be simplified.

Furthermore, an etchant not including a fluorine-containing compound may not be used so that damage to an inorganic insulation layer is prevented.

BRIEF DESCRIPTION OF THE DRAWINGS

The above and other features and advantages will become more apparent by describing exemplary embodiments thereof with reference to the accompanying drawings, in which.

DETAILED DESCRIPTION

The present disclosure of invention now will be described more fully hereinafter with reference to the accompanying drawings, in which various embodiments are shown. These teachings may, however, be embodied in many different forms, and should not be construed as limited to the embodiments set forth herein. Rather, these embodiments are provided so that this disclosure will be thorough and complete, and will fully convey the scope of the teachings to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary terms "on" or "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 1:
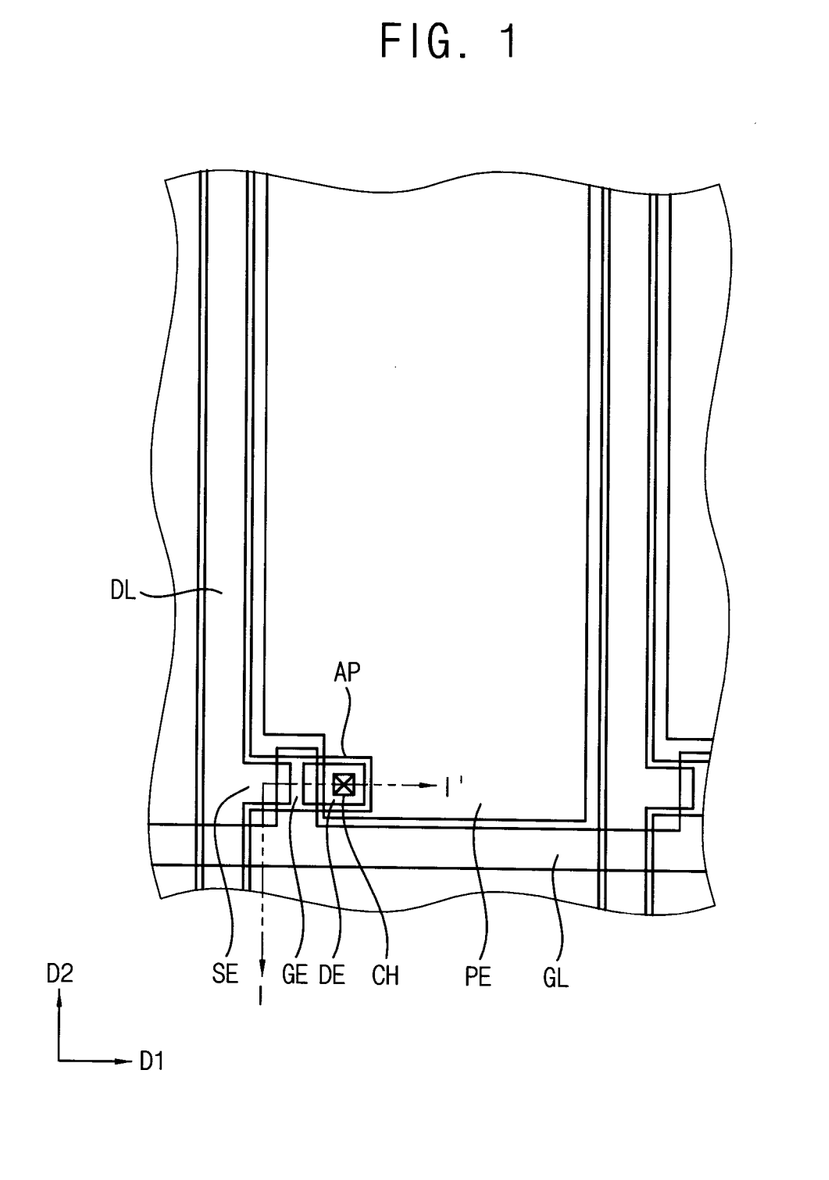
FIG. 1 is a top plan view illustrating a repeated portion of a display substrate according to an exemplary embodiment.
Figure 2:
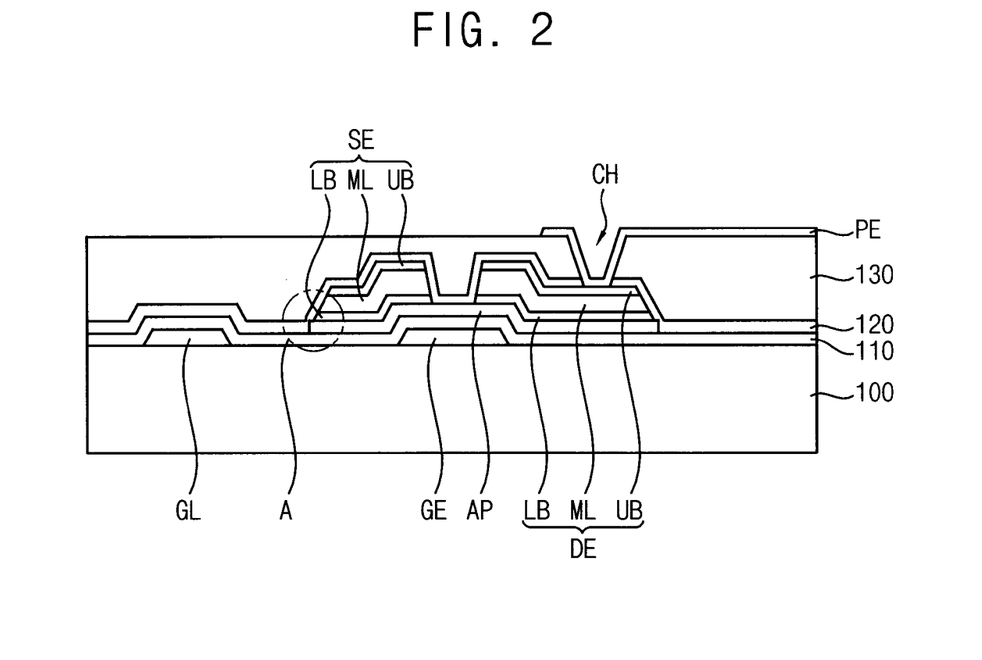
FIG. 2 is a cross-sectional view taken along the line I-I' of FIG. 1.
Figure 3:
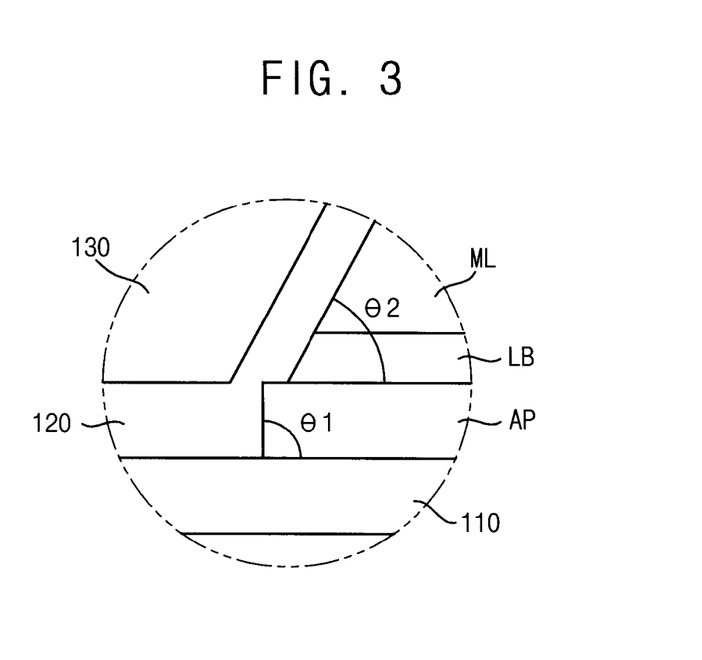
FIG. 3 is a partial enlarged cross-sectional view of FIG. 2.

FIG. 1 is a top plan view illustrating a display area populating and repeating portion of a display substrate according to an exemplary embodiment. FIG. 2 is a cross-sectional view taken along the line I-I' of FIG. 1. FIG. 3 is a partial enlarged cross-sectional view of FIG. 2.

Referring to FIGS. 1 and 2, a display substrate includes a base substrate 100, a gate line GL, a data line DL, a gate insulation layer 110, a thin film transistor (TFT), a passivation layer 120, an organic insulation layer 130 and a pixel electrode PE. The thin film transistor includes a gate electrode GE, an active pattern AP, a source electrode SE and a drain electrode DE.

The gate line GL extends in a first direction D1, and the data line DL extends in a second direction D2, as seen in a top plan view. The first direction D1 intersects with the second direction D2. Furthermore, the first direction D1 may be substantially perpendicular to the second direction D2.

The gate line GL is electrically connected to the gate electrode GE. For example, the gate electrode GE may monolithically integrally protrude as a branch from the gate line GL in the second direction D2.

The active pattern AP overlaps with the gate electrode GE. The source electrode SE and the drain electrode DE are spaced apart from each other, and respectively contact the active pattern AP.

In an embodiment, the source electrode SE and the drain electrode DE respectively have a multiple-layered structure. For example, each of the source electrode SE and the drain electrode DE includes a lower barrier layer LB, a metal layer ML disposed on the lower barrier layer LB, and an upper barrier layer UB disposed on the metal layer ML. The metal layer ML may include a low resistivity metal such as copper, where; as known in the art, copper (Cu) has a tendency to migrate if not blocked by barrier layers and can interfere with functions of other layers. The lower barrier layer LB and the upper barrier layer UB may include a conductive oxide, for example one including titanium. The barrier layers protectively sandwich the metal layer ML and thus protect the active pattern AP from being contaminated by migrating atoms from the low resistivity metal layer ML. In one embodiment, the active pattern AP includes a semiconductive oxide. In another embodiment, the upper barrier layer UB may be omitted.

The data line DL is electrically connected to the source electrode SE. For example, the source electrode SE may monolithically integrally protrude as a branch from the data line DL in the first direction D1. The data line DL, the source electrode SE and the drain electrode DE may be disposed in a same layer. Thus, a source metal pattern formed from a same layer of same conductive materials may include the source electrode SE, the drain electrode DE and the data line DL.

The gate insulation layer 110 covers the gate electrode GE, and the active pattern AP is disposed on the gate insulation layer 110.

The passivation layer 120 covers the thin film transistor. The organic insulation layer 130 is disposed on the passivation layer 120 and may include a planarized upper surface. The pixel electrode PE is disposed on the organic insulation layer 130, and is connected to the drain electrode DE through a contact hole CH formed through the passivation layer 120 and the organic insulation layer 130.

As mentioned, the active pattern AP includes a semiconductive oxide. For example, the semiconductive oxide may include one or more of zinc oxide ("ZnO"), zinc tin oxide ("ZTO"), indium zinc oxide ("IZO"), indium oxide ("InO"), titanium oxide ("TiO"), indium gallium zinc oxide ("IGZO"), indium zinc tin oxide ("IZTO") or the like. These may be used each alone or in a combination. Preferably, the semiconductive oxide may include IGZO.

The active pattern AP is covered by a lower surface of the source metal pattern. Preferably, the active pattern AP underlaps an entire portion of the lower surface of the source metal pattern. Particularly, the active pattern AP underlaps lower surfaces of the source electrode SE and the drain electrode DE. Furthermore, the active pattern AP further underlaps a lower surface of the data line DL. As illustrated in FIGS. 1 to 3 (but best seen in FIG. 3), the active pattern AP may be formed so as to underlap and protrude beyond lateral ends of the source metal pattern including beyond a lateral end of the source electrode SE, beyond a lateral end of the drain electrode DE and beyond a lateral end of the data line DL in a lateral direction.

Referring to FIG. 3, an angle formed between a base surface and a sidewall surface, namely, a first taper angle θ1 of the active pattern AP is different from a corresponding second taper angle θ2 of the source metal pattern. For example, the first taper angle θ1 of the sidewall of the active pattern AP is greater than the second taper angle θ2 made by inclined sidewalls of layers of the source metal pattern. Particularly, the first taper angle θ1 of the active pattern AP may be between about 70 degrees to about 90 degrees, preferably between about 80 degrees to about 90 degrees. At the same time, the corresponding and smaller second taper angle θ2 of the source metal pattern may be between about 50 degrees to about 80 degrees.

As mentioned, the taper angle θ1 of the active pattern AP may be defined as an angle formed by a lower surface and a sidewall surface of the active pattern AP. Similarly the smaller taper angle θ2 of the source metal pattern may be defined as an angle formed between a lower surface and a sidewall surface of the source metal pattern.

A difference between the taper angle θ1 of the active pattern AP and the taper angle θ2 of the source metal pattern may be caused by different effects of respective etching processes used for the active pattern AP and the source metal pattern. The etching processes will be explained more fully in the following.

FIGS. 4 to 12 are cross-sectional views illustrating a method for manufacturing the display substrate illustrated in FIGS. 1 and 2. A method of manufacturing thin film transistors (TFTs) according to an exemplary embodiment may correspond to a process for forming such thin film transistors within a display substrate.

Figure 4:
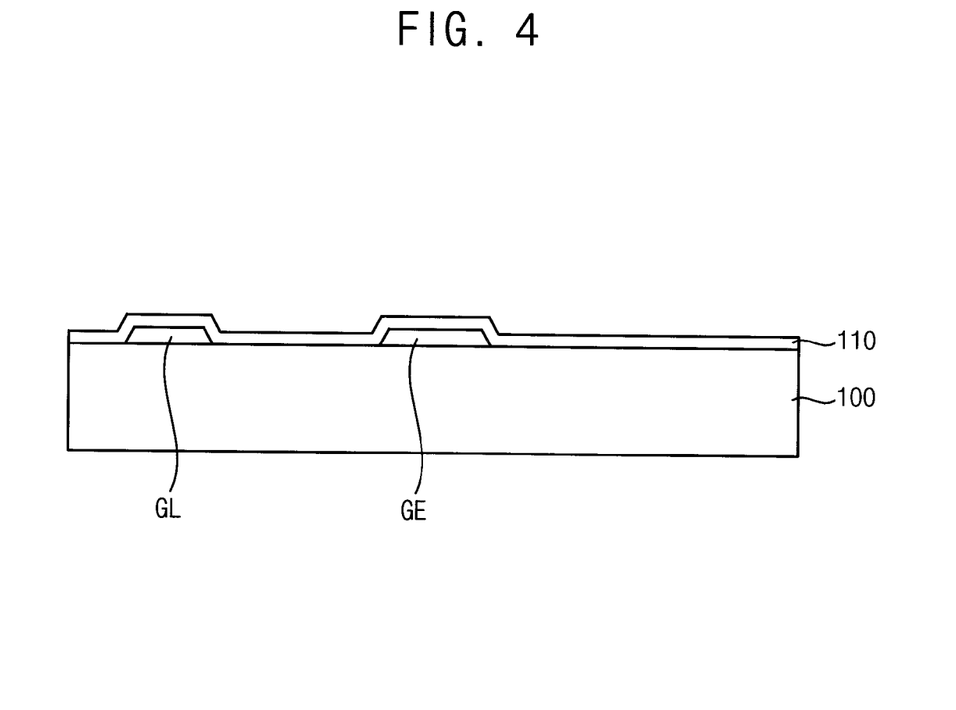
FIGS. 4 to 12 are cross-sectional views illustrating a method for manufacturing the display substrate illustrated in FIGS. 1 and 2.

Referring to FIG. 4, a gate line GL and a gate electrode GE are formed on a base substrate 100. For example, a gate metal layer is formed on the base substrate 100, and patterned to form the gate line GL and the gate electrode GE. Examples of the base substrate 100 may include a glass substrate, a quartz substrate, a silicon substrate, a plastic substrate and the like.

Examples of a material that may be used for the gate metal layer may include copper, silver, chromium, molybdenum, aluminum, titanium, manganese, or an alloy thereof. The gate metal layer may have a single-layered structure or may have a multiple-layered structure including different materials. For example, the gate metal layer may include a copper layer and a titanium layer disposed on and/or under (e.g., sandwiching) the copper layer.

In another embodiment, the gate metal layer may include a metal layer and a conductive oxide layer disposed on and/or under the metal layer. For example, the gate metal layer may include a copper layer and a conductive oxide layer disposed on and/or under the copper layer. Examples of a material that may be used for the conductive oxide layer may include indium zinc oxide ("IZO"), indium tin oxide ("ITO"), gallium zinc oxide ("GZO"), and zinc aluminum oxide ("ZAO").

Thereafter, a gate insulation layer 110 is formed to cover the gate line GL and the gate electrode GE. The gate insulation layer 110 may include a silicon nitride, a silicon oxide or the like. The gate insulation layer 110 may have a single-layered structure or a multiple-layered structure. For example, the gate insulation layer 110 may include a lower insulation sublayer including a silicon nitride and an overlying insulation sublayer including a silicon oxide.

Figure 5:
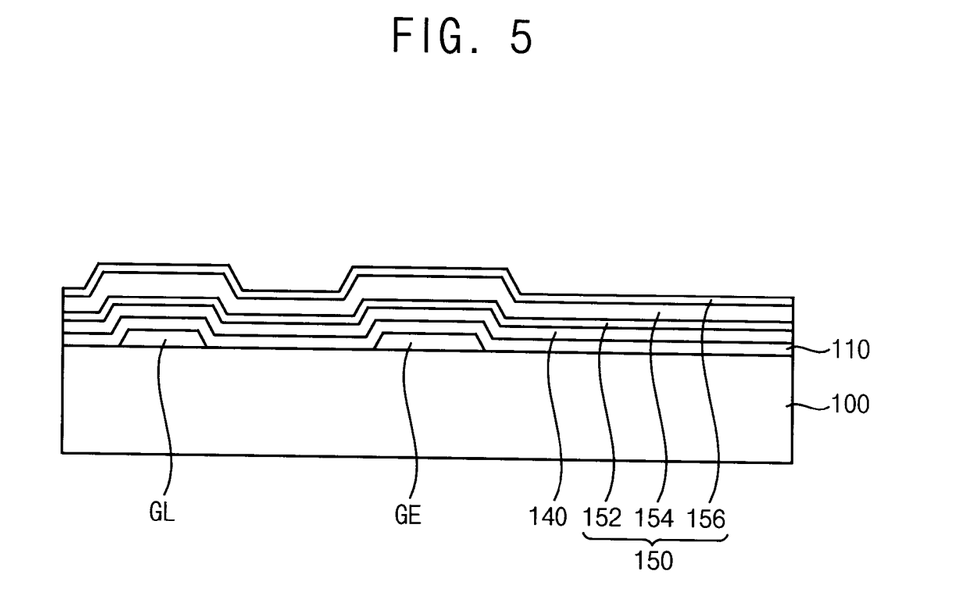

Referring to FIG. 5, a semiconductive oxide layer 140 and a source metal layer 150 are formed on the gate insulation layer 110. The source metal layer includes a lower conductive oxide layer 152, a metal layer 154 and an upper conductive oxide layer 156, which are sequentially deposited on the semiconductive oxide layer 140.

Examples of a material that may be used for the semiconductive oxide layer 140 may include ZnO, ZTO, ZIO, InO, TiO, IGZO, IZTO or the like. In an embodiment, the semiconductive oxide layer 140 includes IGZO.

The semiconductive oxide layer 140 may be formed through conventional methods for forming such semiconductive oxide layers, and may be preferably formed through a physical vapor deposition (PVD) process such as a vacuum deposition process or a sputtering process.

For example, in order to form the semiconductive oxide layer 140, a target having similar composition to the semiconductive oxide layer 140 may be used as an ion bombardment target of a sputtering process.

Preferably, after the semiconductive oxide layer 140 is formed, an annealing process including heating the semiconductive oxide layer 140 may be performed to improve (e.g., homogenize) its microstructure. For example, the annealing process may be performed at a temperature of about 100° C. to about 700° C., and preferably at a temperature of about 300° C. to about 400° C. Electrical characteristics of the semiconductive oxide layer 140 may be improved through the annealing process.

The lower conductive oxide layer 152 and the upper conductive oxide layer 156 include a conductive oxide. Examples of the conductive oxide may include IZO, ITO, GZO, ZAO and the like.

In an embodiment, the metal layer 154 may include copper.

Figure 6:
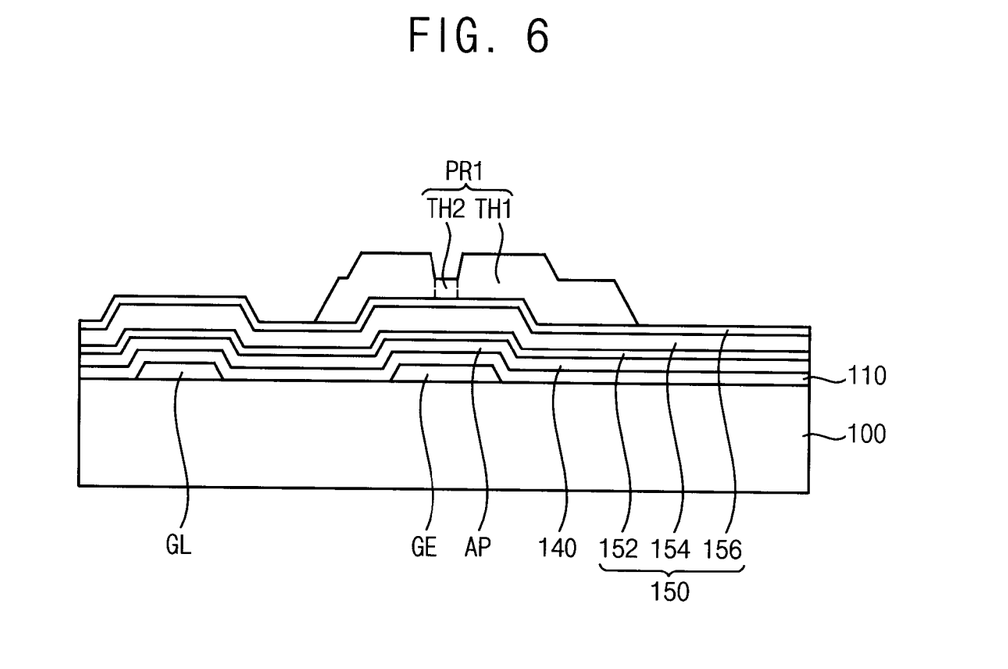

Referring to FIG. 6, a first photoresist pattern PR1 is formed on the source metal layer 150 with multiple thicknesses as shown. In other words, the first photoresist pattern PR1 has a thickness gradient. Particularly, the first photoresist pattern PR1 includes a first thickness portion TH1 and a second thickness portion TH2 thinner than the first thickness portion TH1. The second thickness portion TH2 overlaps with a portion of the active pattern exposed between a source electrode and a drain electrode, which will be explained in the following.

A photoresist composition may be coated, exposed to a light and developed to form the first photoresist pattern PR1 with plural thicknesses. For example, a half-tone exposure using a mask including a slit, a semi-transmission portion or the like may by used so that the first photoresist pattern PR1 may have a thickness gradient including different thicknesses (e.g., TH1, TH2).

Figure 7:
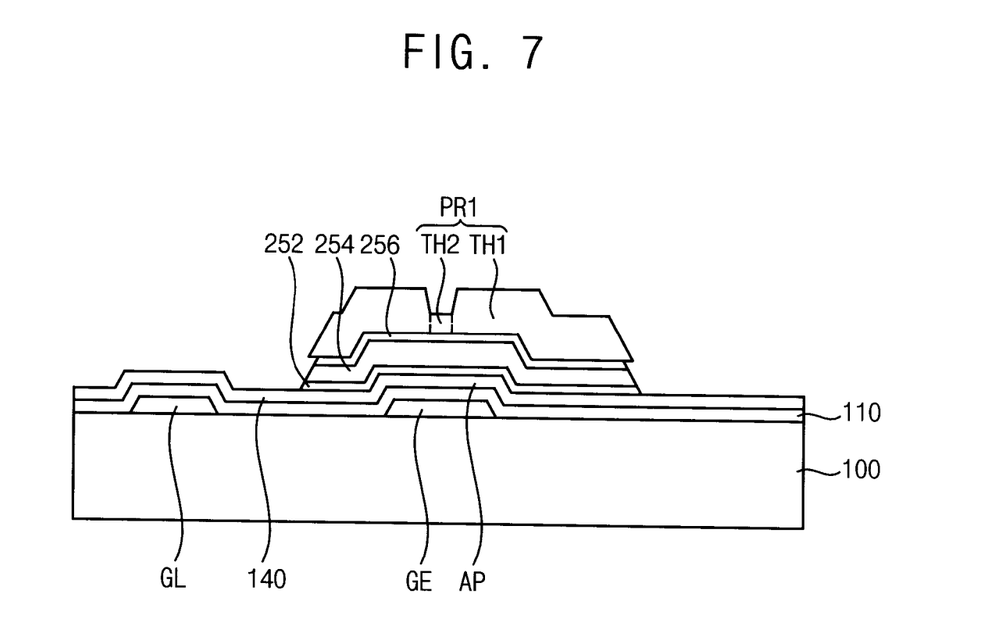

Referring to FIG. 7, the source metal layer 150 is etched by using the first photoresist pattern PR1 as a mask to form a source metal pattern. The source metal pattern includes a lower conductive oxide pattern 252, a metal pattern 254 and an upper conductive oxide pattern 256. A portion of the source metal pattern overlaps with the gate electrode GE, and another portion of the source metal pattern forms a data line. As the source metal layer 150 is etched, the semiconductive oxide layer 140 is partially exposed in regions beyond the ends of the lower conductive oxide pattern 252.

The source metal layer 150 may be etched through a selective wet-etching process using an etchant. The etchant may not substantially etch the semiconductive oxide layer 140.

The etchant may include a persulfate, an inorganic acid, a phosphate, a cyclic amine compound and water. For example, the etchant may include about 5% to about 20% by weight of a persulfate, about 1% to about 15% by weight of an inorganic acid, about 0.1% to about 5% by weight of a phosphate, about 0.3% to about 5% by weight of a cyclic amine compound and a remainder essentially composed of water.

Examples of the persulfate may include ammonium persulfate, potassium persulfate, sodium persulfate and the like. Examples of the inorganic acid may include nitric acid, sulfuric acid, phosphoric acid, perchloric acid and the like. Examples of the phosphate may include ammonium phosphate, sodium phosphate, potassium phosphate and the like. Examples of the cyclic amine compound may include aminotriazole. Furthermore, the etchant may further include a sulfonic compound such as paratoluenesulfonic acid (PTSA).

Preferably, the etchant does not include a fluorine-containing compound such as fluoric acid, fluoride or the like. The fluorine-containing compound may etch or damage the semiconductive oxide layer 140.

Figure 8:
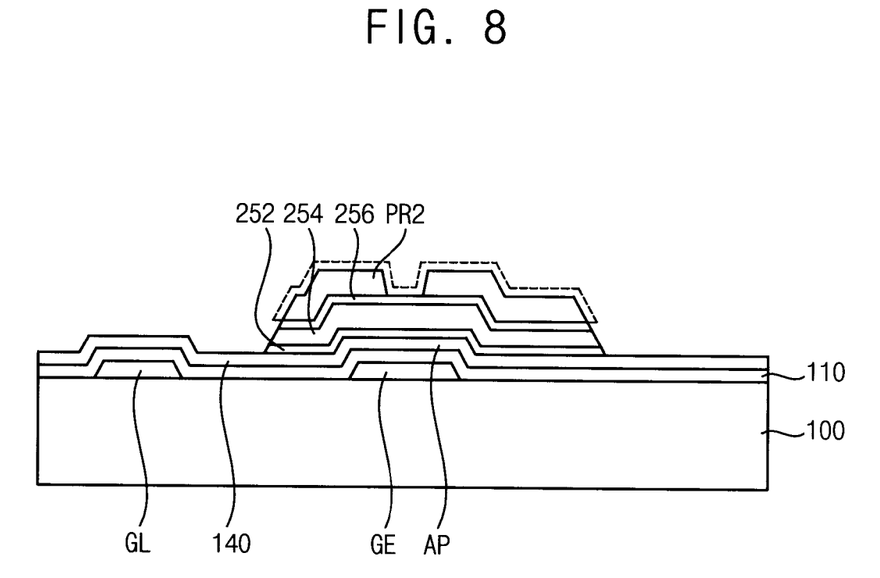

Referring to FIG. 8, the first photoresist pattern PR1 is partially removed for example through an end-point limited ashing process. The end point is exposure of the channel overlapping region of the upper conductive oxide pattern 256. As a result, the second thickness portion TH2 is fully removed, but the first thickness portion TH1 partially remains to form a second photoresist pattern PR2.

The second photoresist pattern PR2 partially covers an upper surface of the source metal pattern so that the upper surface of the source metal pattern is partially exposed.

Figure 9:
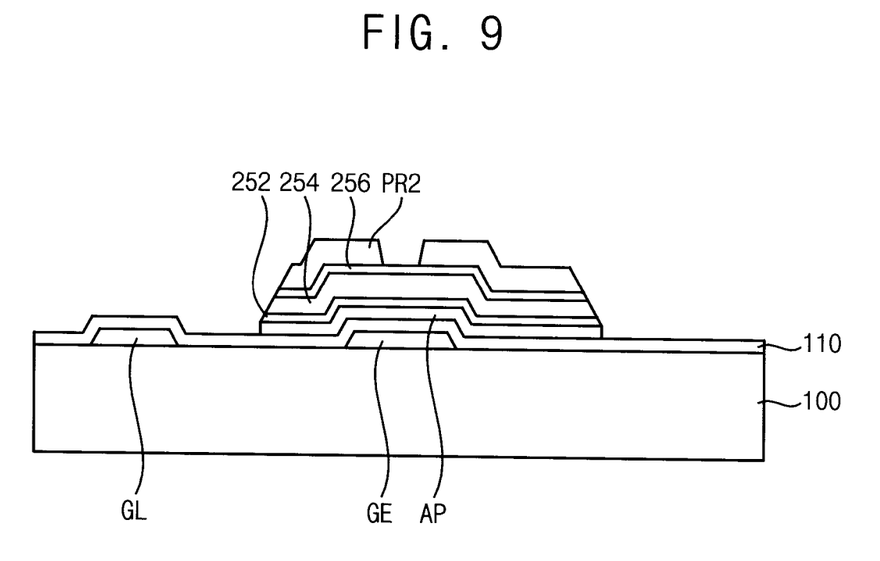

Referring to FIG. 9, the semiconductive oxide layer 140 is anisotropically etched to form an active pattern AP. The semiconductive oxide layer 140 is etched through a dry-etching process.

Because the active pattern AP is formed through an anisotropic process such as dry-etching process, a conductive protrusion of the active pattern AP may be reduced when compared to the results of a conventional isotropic method using a wet-etching process.

Figure 10:
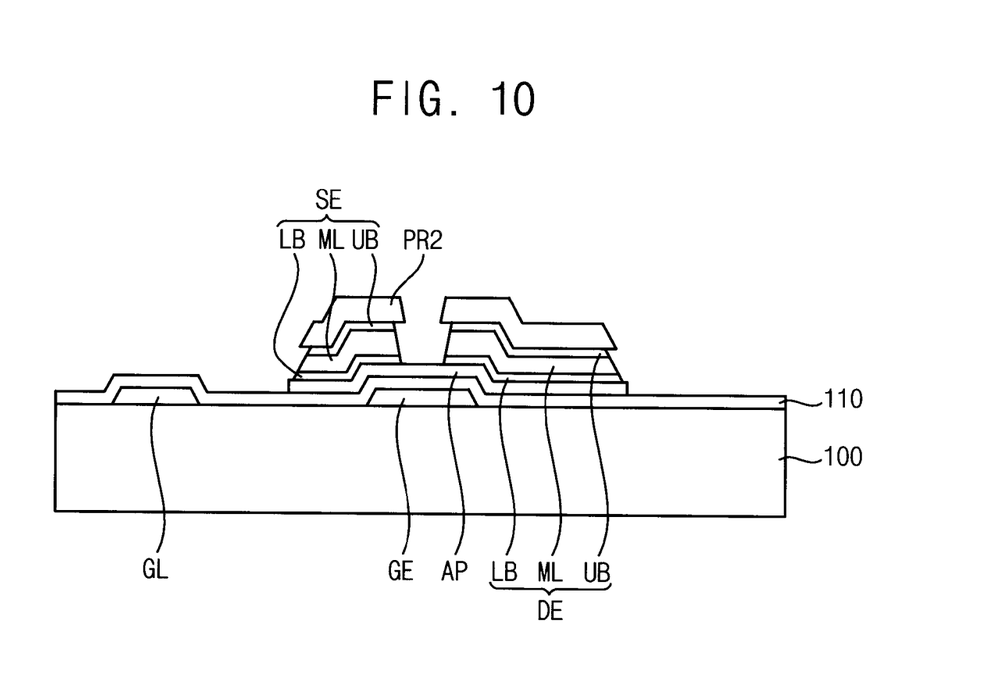
Figure 11:
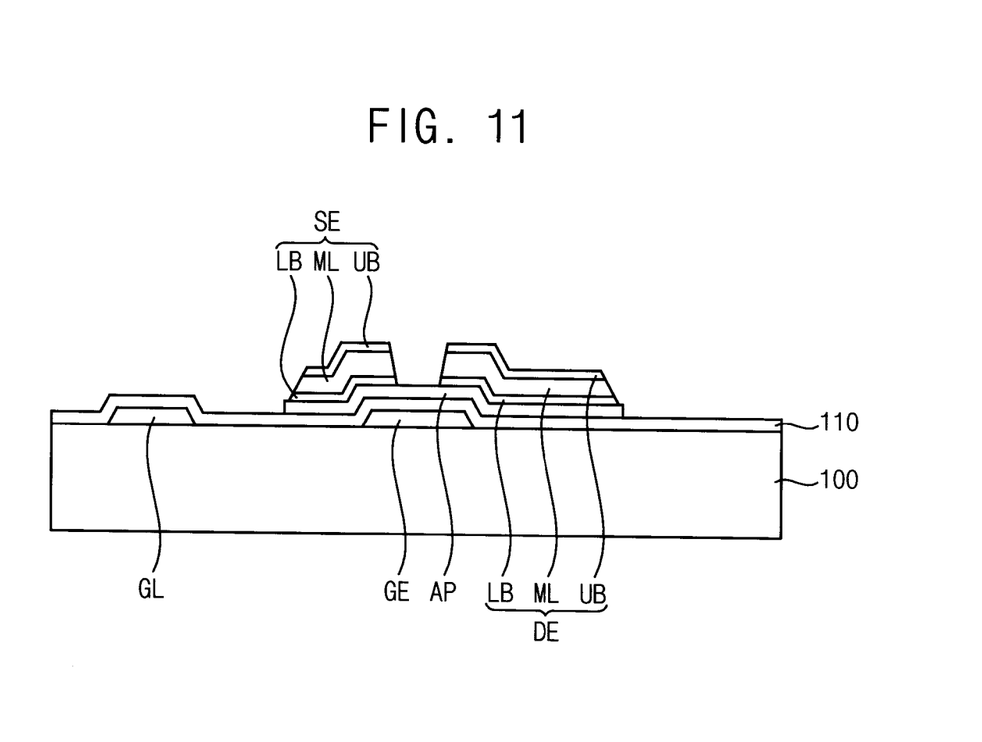

Referring to FIG. 10, the source metal pattern is etched by using the second photoresist pattern PR2 as a mask to form a source electrode SE and a drain electrode DE and to partially expose an upper surface of the active pattern AP. As a result, a thin film transistor is formed.

The source metal pattern may be etched through an isotropic wet-etching process, and an etchant same as the etchant used for etching the source metal layer 150 may be used.

In the process of etching the source metal pattern, a side surface of the source metal pattern may be partially etched so that the active pattern AP may protrude from the source metal pattern in a lateral direction. However, because the active pattern AP is formed through an anisotropic process such as dry-etching process after the source metal layer 150 is wet-etched, a conductive protrusion of the active pattern AP (which can define a parasitic capacitance) may be minimized, and an additional mask is not required for realizing this result.

The active pattern AP formed through the anisotropic dry-etching process has a taper angle greater than a taper angle of the source metal pattern including the source electrode SE and the drain electrode DE. For example, the taper angle $\theta 1$ of the active pattern AP may be between about 70 degrees to 90 degrees, and preferably 80 degrees to 90 degrees. The comparatively smaller taper angle $\theta 2$ of the source metal pattern may be between about 50 degrees to 80 degrees.

Figure 12:
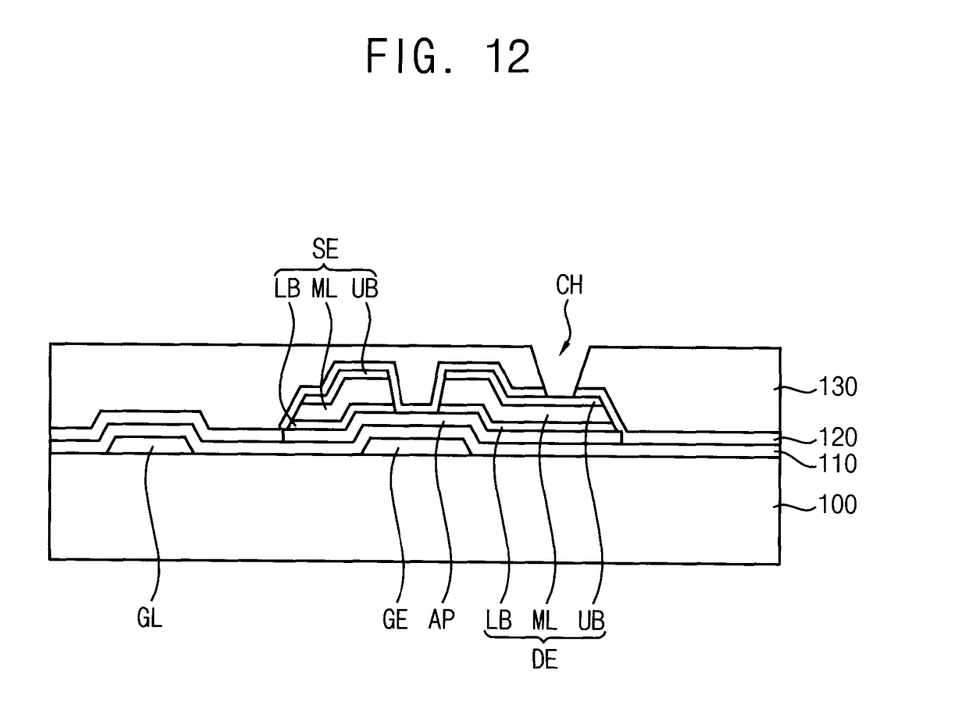

Referring to FIG. 12, a passivation layer 120 is formed to cover the thin film transistor, and an organic insulation layer 130 is formed on the passivation layer 120.

The passivation layer 120 includes an inorganic insulation material. For example, the passivation layer 120 may include a silicon oxide, a silicon nitride or the like.

The organic insulation layer 130 includes an organic insulation material. The organic insulation layer 130 provides a planarized upper surface for the substrate. A photoresist composition may be spin-coated to form the organic insulation layer 130. In another embodiment, a color filter may be formed on the passivation layer 120 instead of the organic insulation layer 130, or may be formed between the passivation layer 120 and the organic insulation layer 130.

Thereafter, a contact hole is formed through the organic insulation layer 130 and the passivation layer 120 to expose the drain electrode DE. A transparent conductive layer is formed on the organic insulation layer 130. Examples of a material that may be used for the transparent conductive layer may include ITO, IZO and the like. A portion of the transparent conductive layer contacts the drain electrode DE through the contact hole.

Thereafter, the transparent conductive layer is patterned to form a pixel electrode PE such as the one illustrated in FIG. 2. An alignment layer (not illustrated) may be formed on the pixel electrode PE to align liquid crystal molecules when no electric field is present. In another embodiment, the display substrate may further include a common electrode forming an electric field with the pixel electrode PE and being disposed on or under the pixel electrode PE.

In the illustrated embodiment, the thin film transistor has a bottom-gate structure in which a gate electrode is disposed under an active pattern. However, in another embodiment, the thin film transistor may have a top-gate structure in which a gate electrode is disposed on an active pattern.

According to an exemplary embodiment, a protrusion of an active pattern may be minimized without an additional mask.

Furthermore, a source metal layer and a source metal pattern may be etched by a same etchant in contrast to a conventional method using different etchants. Thus, managing processes for manufacturing a display substrate may be simplified.

Furthermore, a conventional method uses an etchant capable of etching both a source metal layer and a semiconductive oxide layer includes a fluorine-containing compound, which may damage an inorganic insulation layer such as a gate insulation layer. However, the method according to the here-provided exemplary embodiment may use an etchant not including a fluorine-containing compound to prevent damage to the inorganic insulation layer.

A thin film transistor, a display substrate, and a method of manufacturing the thin film transistor according to exemplary embodiments may be used for a display device such as a liquid crystal display panel.

The foregoing is illustrative and is not to be construed as limiting thereof. Although a few exemplary embodiments have been described, those skilled in the art will readily appreciate in light of the foregoing that many modifications are possible in the exemplary embodiments without materially departing from the novel teachings, aspects, and advantages of the present disclosure. Accordingly, all such modifications are intended to be included within the scope of this disclosure. In the claims, means-plus-function clauses are intended to cover the structures described herein as performing the recited function and not only structural equivalents but also equivalent structures.

What is claimed is:

1. A thin film transistor structure comprising:
   a gate electrode disposed on a substrate;
   an active pattern overlapping the gate electrode and comprising a semiconductive oxide; and
   a source metal pattern disposed on the active pattern and including a metal layer and a lower barrier layer disposed under the metal layer and contacting the active pattern, the source metal pattern including a source electrode and a drain electrode spaced apart from one another,
   wherein the active pattern underlaps an entire portion of a lower surface of the source metal pattern, and has a base and a sidewall defining a first taper angle that is greater than a second taper angle defined by an adjacent sidewall and the lower surface of the source metal pattern, and protrudes outwardly from a side surface of the source metal pattern in a lateral direction.

2. The thin film transistor structure of claim 1, wherein the second taper angle of the source metal pattern is between about 50 degrees to about 80 degrees.

3. The thin film transistor structure of claim 1, wherein the first taper angle of the active pattern is between about 70 degrees to about 90 degrees.

4. The thin film transistor structure of claim 1, wherein the active pattern comprises at least one member selected from the group consisting of zinc oxide, zinc tin oxide, indium zinc oxide, indium oxide, titanium oxide, indium gallium zinc oxide and indium zinc tin oxide.

5. The thin film transistor structure of claim 1, wherein the source metal pattern further comprises an upper barrier layer disposed on the metal layer.

6. The thin film transistor structure of claim 1, wherein the metal layer comprises copper.

7. The thin film transistor structure of claim 1, wherein the lower barrier layer comprises at least one member selected from the group consisting of indium zinc oxide, indium tin oxide, gallium zinc oxide and zinc aluminum oxide.

8. A display substrate comprising a base substrate and a plurality of pixel units formed on the base substrate, each of the pixel units comprising:
   a gate electrode disposed on a base substrate;
   an active pattern overlapping the gate electrode and comprising a semiconductive oxide;
   a source metal pattern disposed on the active pattern and including a metal layer and a lower barrier layer disposed under the metal layer and contacting the active pattern, the source metal pattern including a source electrode and a drain electrode spaced apart from the source electrode; and
   a pixel electrode electrically connected to the drain electrode,
   wherein the active pattern underlaps an entire portion of a lower surface of the source metal pattern, and has a base and a sidewall defining a first taper angle that is greater than a second taper angle defined by an adjacent sidewall and the lower surface of the source metal pattern, and protrudes outwardly from a side surface of the source metal pattern in a lateral direction.

9. The display substrate of claim 8, wherein the active pattern comprises at least one member selected from the group consisting of zinc oxide, zinc tin oxide, indium zinc oxide, indium oxide, titanium oxide, indium gallium zinc oxide and indium zinc tin oxide.

10. The display substrate of claim 8, wherein the metal layer comprises copper, and the lower barrier layer comprises at least one member selected from the group consisting of indium zinc oxide, indium tin oxide, gallium zinc oxide and zinc aluminum oxide.

* * * * *